(12) United States Patent
Smith

(10) Patent No.: US 6,509,605 B1
(45) Date of Patent: Jan. 21, 2003

(54) FLASH MEMORY CELL HAVING A FLEXIBLE ELEMENT

(75) Inventor: Charles Smith, Cambridge (GB)

(73) Assignee: Cavendish Kinetics Limited, Hertfordshire (GB)

( * ) Notice: Subject to any disclaimer, the term of this patent is extended or adjusted under 35 U.S.C. 154(b) by 0 days.

(21) Appl. No.: 09/913,818
(22) PCT Filed: Feb. 21, 2000
(86) PCT No.: PCT/GB00/00608
§ 371 (c)(1),
(2), (4) Date: Aug. 17, 2001
(87) PCT Pub. No.: WO00/55918
PCT Pub. Date: Sep. 21, 2000

(30) Foreign Application Priority Data

Mar. 18, 1999 (EP) ............................................ 99302083

(51) Int. Cl.$^7$ .................. H01L 29/788; H01L 29/82
(52) U.S. Cl. ........................................ 257/316; 257/415
(58) Field of Search ................................ 257/316, 415

(56) References Cited

U.S. PATENT DOCUMENTS 4,979,149 A * 12/1990 Popovic et al. ............. 257/368
6,054,745 A * 4/2000 Nakos et al. ................ 257/296

* cited by examiner

Primary Examiner—Olik Chaudhuri
Assistant Examiner—Howard Weiss
(74) Attorney, Agent, or Firm—Cantor Colburn LLP

(57) ABSTRACT

A memory element for a flash memory including a first element made from electrically conductive material and having a stable position, an electrically conductive floating gate for storing charge, and means for urging the element from the stable position towards a position enabling a transfer of charge to the floating gate.

15 Claims, 2 Drawing Sheets

FLASH MEMORY CELL HAVING A FLEXIBLE ELEMENT

TECHNICAL FIELD

This invention relates to an element for use in a flash memory.

The most commonly used non-volatile semiconductor memory device is the flash memory device. Such a device is capable of both being written to and erased. A popular configuration of the device consists of a silicon substrate with an insulating dielectric formed thereon. An isolated conducting gate is formed on the insulating dielectric with a second conducting gate placed on an insulating layer above the whole structure. The substrate is usually p-type material. By providing the second gate with a positive potential the device becomes conductive, as electrons are attracted to the interface between the insulator and the silicon substrate. The voltage at which the device turns on is usually referred to as the threshold voltage of the device, and is dependent upon the amount of charge stored in the insulator, or floating gate.

BACKGROUND OF THE INVENTION

The charge stored on the floating gate is adjusted by injecting electrons from the silicon substrate to the gate. This is achieved either by providing a large source-drain voltage which generates hot carriers which can tunnel more easily into the gate or by using Fowler Nordheim tunnelling through a very thin insulating oxide layer. The problem with the former technique is that only a small fraction of the current runs into the floating gate, therefore requiring large currents to program the gate as a whole, making the device very power greedy. Another problem with the former approach is that the programming of a large number of elements takes a long time because any metallised supply leads can only take a limited amount of current. The latter approach also has a number of problems, in particular in relation to the need to grow a very thin insulating oxide layer that does not allow tunnelling when power is off. Furthermore, it is desirable for the charge on the floating gate to be stored over very long periods, but the provision of a thin oxide insulation means that this is difficult to achieve.

Another problem associated with either approach is that tunnelling of electrons results in a degredation of the properties of the insulating oxide, and also in charge being stored in the oxide. Eventually, after perhaps as few as 100,000 programming cycles, the device fails. Even before this the threshold voltage will start to shift from expected values.

With the above-described flash memory element charge is removed from the floating gate by providing a negative bias to the second top gate, causing electrons to tunnel through the insulator to the silicon substrate, or by ensuring holes are injected from the second top gate to the floating gate to reduce the charge stored thereon. This process can be very slow.

With this type of element the charge stored on the floating gate may represent a binary value, as determined by whether or not the value of the charge exceeds a predetermined level. In recent times, however, devices which represent more than a single binary value, employing several threshold levels, have been provided. With these last devices the need to provide an accurate amount of charge and to prevent leakage has become particularly important.

SUMMARY OF THE INVENTION

According to the present invention there is provided a memory element for a flash memory comprises a first element made from electrically conductive material and having a stable position, an electrically conductive floating gate for storing charge, and means for urging the element from its stable position towards a position in which it enables the transfer of charge to the floating gate.

The charge may be transferred from the first element to the floating gate or may be transferred from a second element which contacts the floating gate when the first element is in its charge transfer position. The element may be formed on a semiconductor (such as silicon) substrate, with the floating gate mounted thereon, separated by an insulating layer. Alternatively, the floating gate may be mounted on the first element, with an insulating layer positioned therebetween.

The first element may be urged into its charge transfer position by an electric field generated by the semiconductor substrate or by a dedicated switching electrode.

A flash memory device comprising the above-defined element is also provided, as is a corresponding method of storing electrical charge.

The present invention provides an element which can be programmed and erased very quickly. In many embodiments it also avoids the need for the provision of a thin oxide insulating layer.

BRIEF DESCRIPTION OF THE DRAWINGS

One example of the present invention will now be described with reference to the accompanying drawings, in which:

Referring to FIG. 1, a known flash memory element 1 has a semiconductor substrate 2 formed from silicon. The element has a source 3 and a drain 4. Formed on the substrate 2 is an oxide insulating layer 5 which encases a conductive "floating" gate 6. Formed on top of the insulating oxide is a second gate 7, also formed from an electrically conductive material.

DETAILED DESCRIPTION OF THE INVENTION

Figure 1:
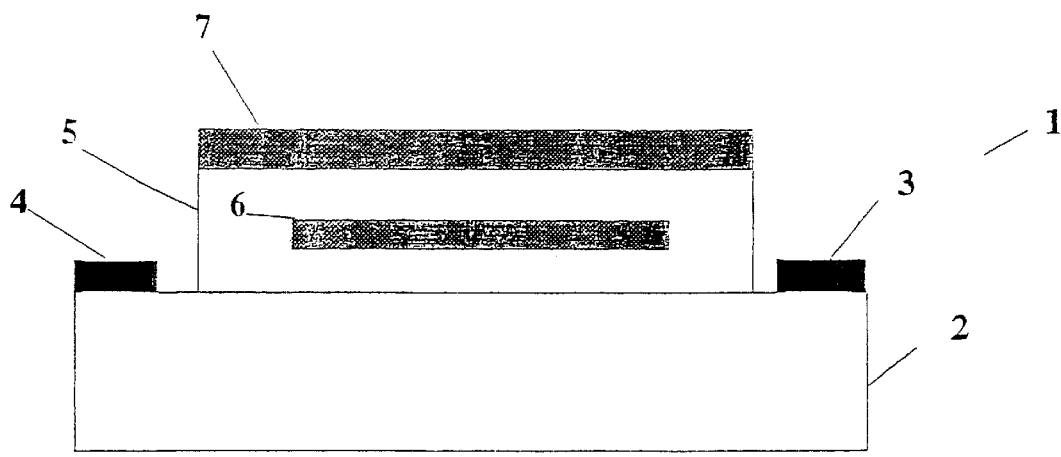
FIG. 1 is a schematic diagram of a prior art flash memory element.

As discussed above, information is stored in the element 1 by applying and retaining charge on the floating gate 6 the element can be erased by removal of charge from the floating gate 6, and both application and removal of the charge is performed by the application of a positive or negative potential to the second gate 7 whilst current passes through the substrate 2 via the source 3 and drain 4.

Figure 2A:
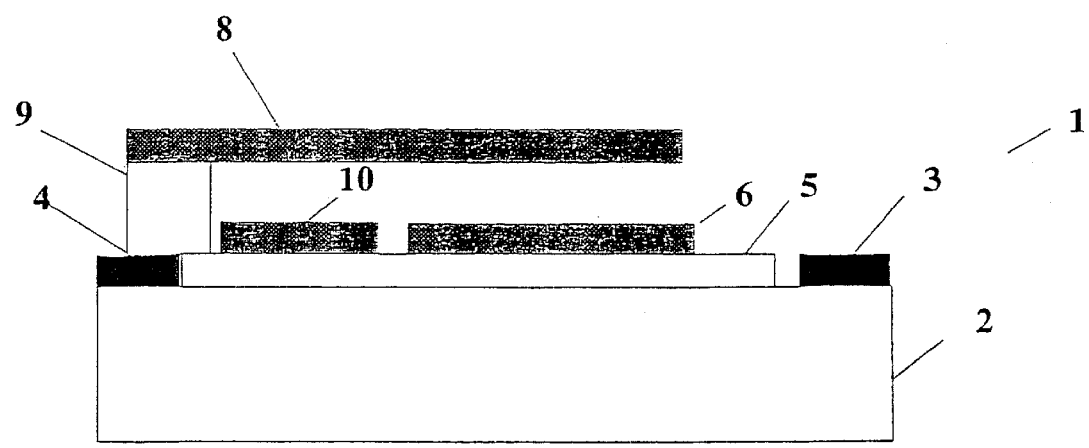
FIGS. 2A and 2B are schematic diagrams of a first example flash memory element according to the present invention.
Figure 2B:
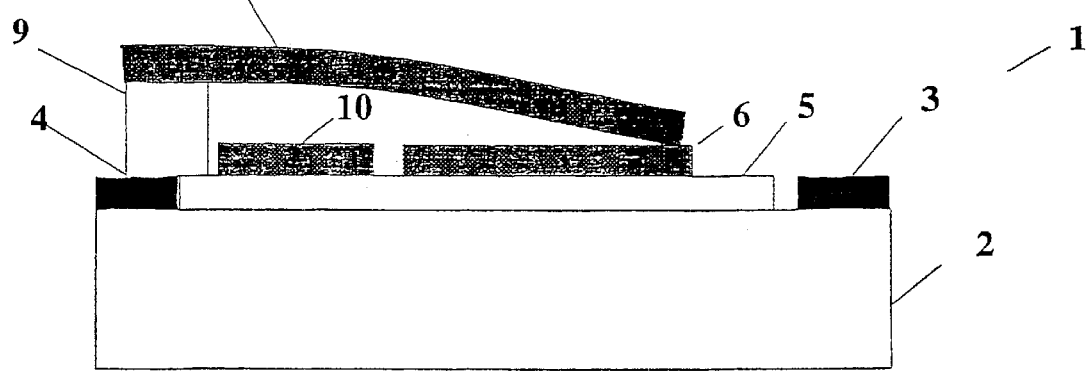

FIGS. 2A and 2B show a first example of the present invention, in which components corresponding to those in the prior art of FIG. 1 are numbered identically. In this example of the present invention the floating gate 6 is isolated from a silicon substrate 2 by an insulating oxide layer 5. In place of a top gate 7 there is provided, however, a cantilever 8 which is electrically conductive. The cantilever 8 is supported at one end by insulating oxide 9, but has a free end disposed above the floating gate 6. Charge can be applied to the floating gate by urging the cantilever 8 into contact with the floating gate 6, allowing charge to be transferred from the cantilever 8. It will be appreciated that the counterlever may not actually contact the floating gate 6 and charge may still be transferred by gap tunnelling of electrons. The floating gate may, if necessary have a very thin insulating layer formed thereon to provide increased charge retention. The cantilever 8 is urged into contact by an electric field that may be generated either by the application of an appropriate voltage to a switching electrode 10 or by generation of sufficient potential on the substrate 2. Once charge has been transferred to the gate 6 the electric field can be removed and the cantilever 8 moves out of contact with the floating gate 6.

With the present invention the value of the charge is read in a manner similar to that in the prior art. Because there is no need to transfer charge via the insulating oxide layer 5, however, this can be made much thicker, preventing tunnelling. Furthermore, the value of the charge stored can be controlled to a high degree of accuracy because the charge transfer process involves direct electrical contact between two electrodes. This is particularly advantageous if more than a single threshold voltage is to be measured with the elements. A further advantage is that far less programming current is required, reducing the overall power requirements of the device.

Of course, it will be appreciated that the voltage required to turn the silicon substrate to on, in order to measure threshold voltage, is far less than that required to urge the cantilever 8 onto the floating gate 6.

Figure 3A:
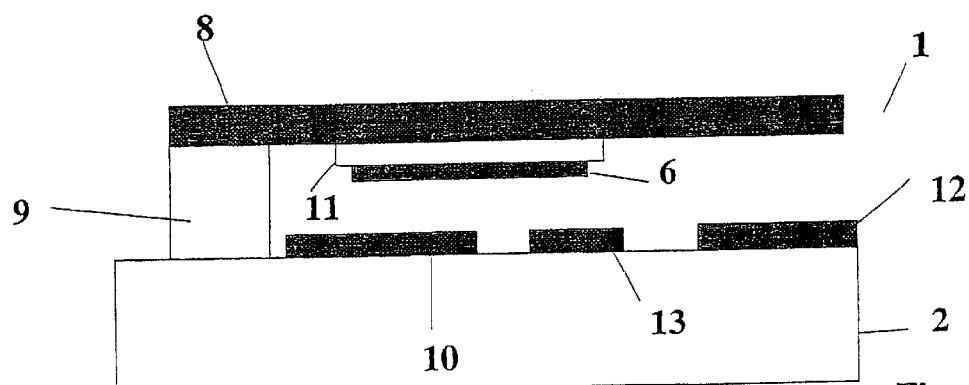
FIGS. 3A to 3C are schematic diagrams of a second example of the present invention.
Figure 3B:
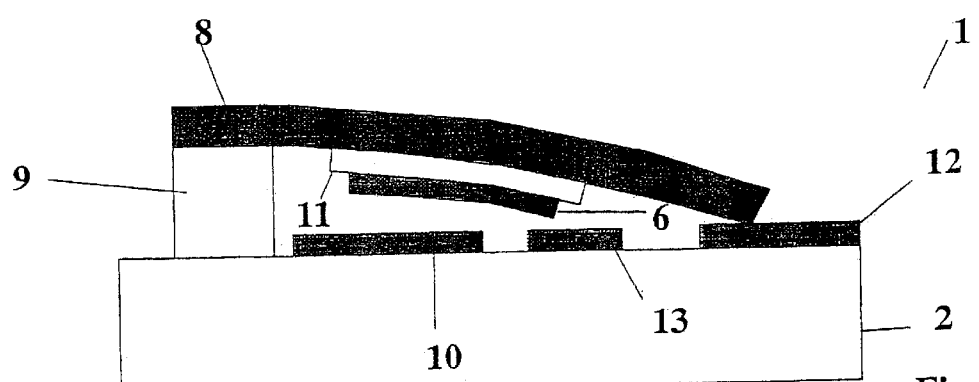
Figure 3C:
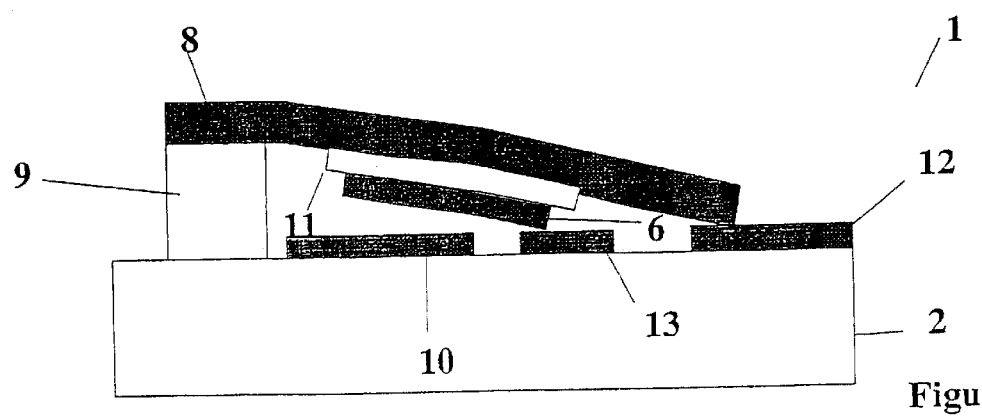

FIG. 3 shows a second example of the present invention, in which components corresponding to those in FIGS. 2A and 2B are numbered identically. In this example, the cantilever 8 supports the floating gate, but is isolated therefrom by an insulating layer 11. In this example either Fowler-Nordheim tunnelling or hot electron injection stores on the floating gate 6. A switching electrode 10 is again employed to draw the cantilever 8, and attract floating gate 6 towards a substrate 2. In this example the substrate 2 does not have to be a semiconductor, reducing fabrication costs. Two electrodes 12, 13 are provided. The first electrode 12 determines when the cantilever 8 is urged towards the substrate 2. The voltage of the switching electrode 10 at the time of cantilever movements can be employed to determine the charge stored on the floating gate 6. As an alternative to provision of tunnelling techniques to provide charge to the floating gate the further electrode 13 can be employed to transfer charge to the floating gate 6, in a manner similar to that in which charge is transferred from the cantilever 8 to the floating gate 6 in the example of FIGS. 2A and 2B.

What is claimed is:

1. A memory element comprising:
   a first element made from electrically conductive material and having a stable position;
   an electrically conductive floating gate for storing charge and mounted on the first element;
   means for urging the first element from the stable position towards a position enabling a transfer of charge to the floating gate; and
   a second element, made form electrically conductive material, from which the charge is transferred to the floating gate when the first element is in the charge transfer position.

2. A memory element according to claim 1, wherein the charge is transferred from the first element to the floating gate.

3. A memory element according to claim 1, wherein the means for urging the first element comprises a switching electrode to which a potential can be applied.

4. A memory element according to claim 1, further comprising a semiconductor substrate upon which components of the first element are mounted.

5. A memory element according to claim 4, wherein the means for urging the first element is an electric field generated by the semiconductor substrate in use.

6. A memory element according to claim 1, wherein the first element is a cantilever.

7. A memory element according to claim 1, configured to store a variable threshold value.

8. A memory element according to claim 1, wherein the charge transfer to the floating gate is measured by means for determining, in use, an applied potential voltage at which the first element is urged into engagement with a detecting contact.

9. A memory element according to claim 1, wherein the charge stored on the floating gate is determined by means for determining, in use, an applied potential voltage at which the first element is urged out of contact with a detecting contact.

10. A flash memory device comprising:
    a semiconductor substrate with an insulating dielectric formed thereon; and
    a memory element including a first element made from electrically conductive material and having a stable position; an electrically conductive floating gate for storing charge and mounted on the first element; means for urging the first element from the stable position towards a position enabling a transfer of charge to the floating gate; and a second element, made form electrically conductive material, from which the charge is transferred to the floating gate when the first element is in the charge transfer position.

11. A method of storing electrical charge representing information comprising:
    urging an electrically conductive first element having a floating gate mounted thereon from a stable position to a second position; transferring a charge from an electrically conductive second element to the floating gate; and allowing the first element to return to the stable position.

12. A method according to claim 11, wherein the electrically conductive first element is urged from its stable position by an electric field.

13. A method according to claim 12, wherein the electric field is generated by a switching electrode.

14. A method according to claim 12, wherein the electric field is generated by a semiconductor substrate.

15. A method according to claim 11, wherein a value of the charge can be varied.

* * * * *